US010714603B2

(12) United States Patent
Naito

(10) Patent No.: US 10,714,603 B2
(45) Date of Patent: Jul. 14, 2020

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/136,287

(22) Filed: Sep. 20, 2018

(65) Prior Publication Data
US 2019/0019885 A1 Jan. 17, 2019

Related U.S. Application Data

(63) Continuation of application No. PCT/JP2017/037398, filed on Oct. 16, 2017.

(30) Foreign Application Priority Data

Oct. 17, 2016 (JP) .................. 2016-203939

(51) Int. Cl.
*H01L 29/739* (2006.01)
*H01L 29/06* (2006.01)
(Continued)

(52) U.S. Cl.
CPC ........ *H01L 29/7397* (2013.01); *H01L 21/266* (2013.01); *H01L 27/0635* (2013.01);
(Continued)

(58) Field of Classification Search
CPC ............... H01L 29/7397; H01L 21/266; H01L 27/0635; H01L 29/0615; H01L 29/0619;
(Continued)

(56) References Cited

U.S. PATENT DOCUMENTS 6,118,150 A 9/2000 Takahashi
2008/0251838 A1* 10/2008 Ono .................... H01L 29/0878
257/330
(Continued)

FOREIGN PATENT DOCUMENTS

JP H09270512 A 10/1997
JP 2005294649 A 10/2005
(Continued)

OTHER PUBLICATIONS

International Search Report for International Patent Application No. PCT/JP2017/037398, issued by the Japan Patent Office dated Nov. 28, 2017.

*Primary Examiner* — Dzung Tran

(57) ABSTRACT

A semiconductor device is provided that includes: an edge termination portion provided in the peripheral portion of a semiconductor substrate; and an active portion surrounded by the edge termination portion, wherein the active portion includes: a plurality of gate trench portions arrayed along a predetermined array direction; a plurality of dummy trench portions provided between a gate trench portion closest to the edge termination portion among the plurality of gate trench portions and the edge termination portion; mesa regions located between each of the plurality of dummy trench portions; and accumulation regions with a first conductivity-type provided in at least a part of the mesa regions.

11 Claims, 12 Drawing Sheets

(51) Int. Cl.
*H01L 29/10* (2006.01)
*H01L 29/423* (2006.01)
*H01L 21/266* (2006.01)
*H01L 27/06* (2006.01)
*H01L 29/41* (2006.01)
*H01L 29/12* (2006.01)
*H01L 29/40* (2006.01)
*H01L 29/49* (2006.01)
*H01L 27/07* (2006.01)

(52) U.S. Cl.
CPC ...... *H01L 29/0615* (2013.01); *H01L 29/0619* (2013.01); *H01L 29/0696* (2013.01); *H01L 29/1087* (2013.01); *H01L 29/1095* (2013.01); *H01L 29/12* (2013.01); *H01L 29/407* (2013.01); *H01L 29/41* (2013.01); *H01L 29/423* (2013.01); *H01L 29/4236* (2013.01); *H01L 29/4238* (2013.01); *H01L 29/49* (2013.01); *H01L 29/739* (2013.01); *H01L 27/0727* (2013.01)

(58) Field of Classification Search
CPC ............. H01L 29/0696; H01L 29/1087; H01L 29/1095; H01L 29/12; H01L 29/407; H01L 29/41; H01L 29/423; H01L 29/4236; H01L 29/4238; H01L 29/49; H01L 29/739; H01L 29/0727

USPC ........................................................ 257/139
See application file for complete search history.

(56) References Cited

U.S. PATENT DOCUMENTS

| | | | |
|---|---|---|---|
| 2014/0048847 A1* | 2/2014 | Yamashita | ............ H01L 29/407 257/140 |
| 2015/0144995 A1 | 5/2015 | Takahashi | |
| 2016/0141402 A1* | 5/2016 | Hosokawa | .......... H01L 29/0834 257/144 |
| 2016/0336393 A1* | 11/2016 | Kim | .................... H01L 29/0619 |
| 2017/0025410 A1 | 1/2017 | Cheng et al. | |
| 2017/0250179 A1* | 8/2017 | Senoo | ................ H01L 27/0664 |

FOREIGN PATENT DOCUMENTS

| | | |
|---|---|---|
| JP | 2010238721 A | 10/2010 |
| JP | 2012043890 A | 3/2012 |
| JP | 2013021104 A | 1/2013 |
| JP | 2013026534 A | 2/2013 |
| JP | 2015103697 A | 6/2015 |
| JP | 2015135954 A | 7/2015 |
| WO | 2006082618 A1 | 8/2006 |

* cited by examiner

SEMICONDUCTOR DEVICE

The contents of the following Japanese patent applications are incorporated herein by reference:
NO. 2016-203939 filed in JP on Oct. 17, 2016, and
NO. PCT/JP2017/037398 filed on Oct. 16, 2017.

BACKGROUND OF THE INVENTION

1. Field of the Invention

The present invention relates to a semiconductor device.

2. Description of the Related Art

Conventionally, a semiconductor device is known in which transistors such as IGBTs (Insulated Gate Bipolar Transistors) and diodes such as FWDs (Free Wheeling Diode) are formed on a same chip (for example, refer to see the Patent document 1). Also, providing a trench portion having a gate metal layer in a p type semiconductor layer is known (for example, refer to the Patent document 2).

PRIOR ART DOCUMENTS

Patent Documents

Patent Document 1: Japanese Unexamined Patent Application Publication No. 2015-135954
Patent Document 2: Japanese Unexamined Patent Application Publication No. H09-270512

Carrier storage regions with $n^+$ type may be provided to mesa regions between adjacent gate trench portions. The carrier storage regions are formed by ion implantation, for example. There is an issue that the carrier storage regions are not formed at a predetermined depth in the mesa regions, when an end of a mask used in ion implantation sags.

SUMMARY OF THE INVENTION

In a first aspect of the present invention, a semiconductor device is provided. The semiconductor device may include an edge termination portion and an active portion. The edge termination portion may be provided in the peripheral portion of a semiconductor substrate. The active portion may be surrounded by the edge termination portion. The active portion may have a plurality of gate trench portions, a plurality of dummy trench portions, mesa regions, and accumulation regions. The plurality of gate trench portions may be arrayed along a predetermined array direction. The plurality of dummy trench portions may be provided between the gate trench portion closest to the edge termination portion among the plurality of gate trench portions and the edge termination portion. The mesa regions may be located between each of the plurality of dummy trench portions. The accumulation regions may be provided to at least a part of the mesa regions. The accumulation regions may be a first conductivity-type.

The active portion may further have contact regions. The contact regions may be provided on the front surface of the mesa regions between the plurality of dummy trench portions. The contact regions may be a second conductivity-type.

The active portion may not have the accumulation region in at least one mesa region. The mesa regions may be mesa regions between the plurality of dummy trench portions.

The active portion may further have a well region. The well region may cover the bottoms of two or more dummy trench portions among the plurality of dummy trench portions. The well region may be the second conductivity-type.

The active portion may have mesa regions not including the accumulation regions. The mesa regions not including the accumulation regions may be provided between the well region and the mesa regions including the accumulation regions.

The active region may further have a drift region, a collector region, and an opposite conductivity-type semiconductor region. The drift region may be the first conductivity-type with lower concentration than the accumulation region. The collector region may be located below the drift region. The collector region may be the second conductivity-type. The opposite conductivity-type semiconductor region may be located below the drift region right below the plurality of dummy trench portions. The opposite conductivity-type semiconductor region may be the first conductivity-type with higher concentration than the drift region.

The opposite conductivity-type semiconductor region may be provided in the array direction from the inner end of the well region to the outer end of the mesa regions where the accumulation regions are provided.

The opposite conductivity-type semiconductor region may also be provided in the array direction from the outer end of the well region to the outer end of the mesa regions where the accumulation regions are provided.

Also, the opposite conductivity-type semiconductor region may also be provided in the array direction from the bottoms of guard rings provided in the edge termination portion via the outer end of the well region to the outer end of the mesa regions where the accumulation regions are provided. The active portion may have the accumulation regions in all mesa regions between the plurality of dummy trench portions. The accumulation region may also include the outermost portion located outside from the dummy trench portion closest to the edge termination portion among the plurality of dummy trench portions.

Note that the summary of the invention described above shall not necessarily describe all necessary features of the embodiments of the present invention. The present invention may also be a sub-combination of the features described above.

DESCRIPTION OF EXEMPLARY EMBODIMENTS

Hereinafter, the present invention is described through the embodiments of the invention. However, the following embodiments shall not limit the invention according to the claims. In addition, all the combinations of features described in the embodiments are not necessarily essential to means provided by aspects of the invention.

Figure 1:
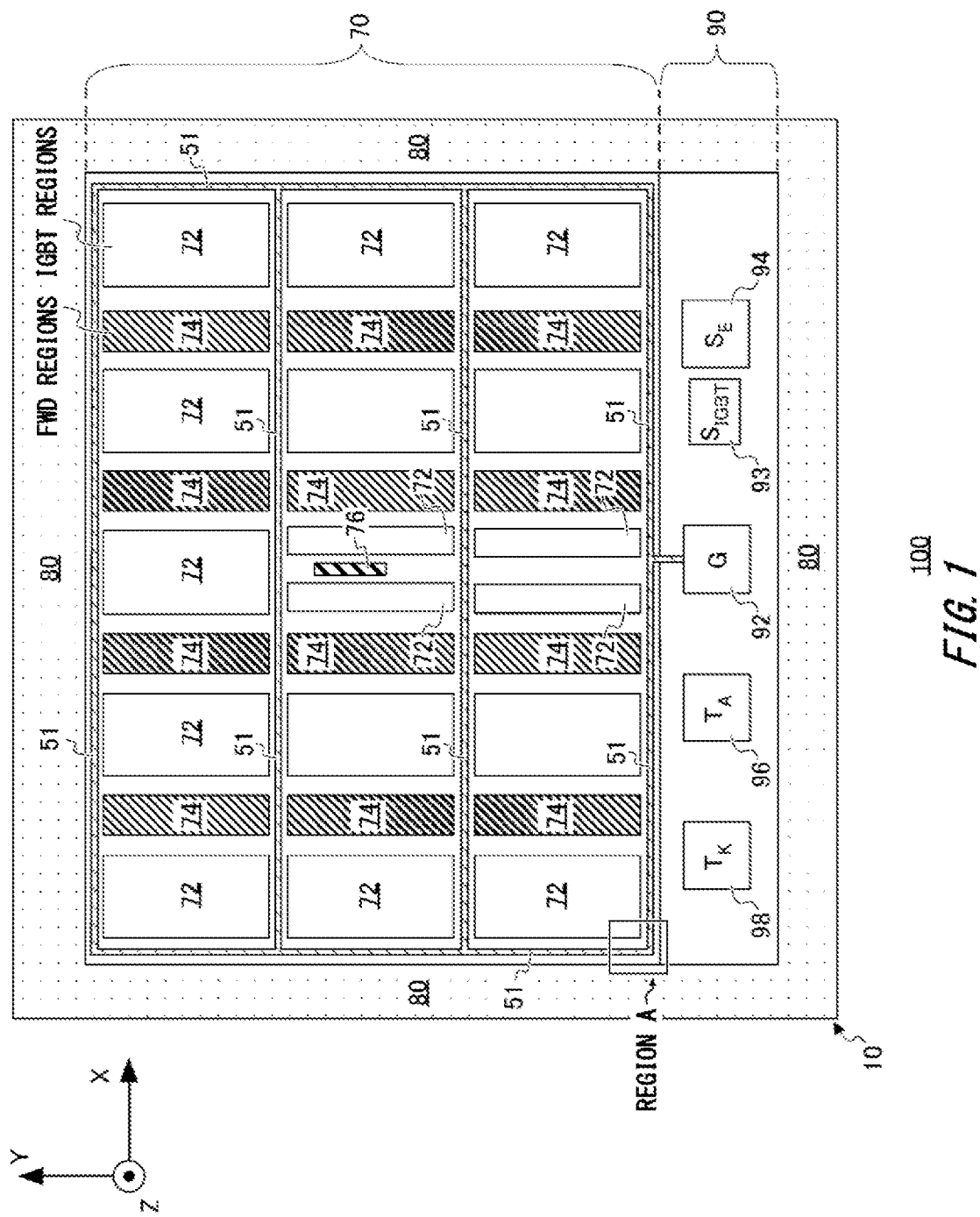
FIG. 1 is a top view of a semiconductor device 100 according to a first embodiment.

FIG. 1 is a top view of a semiconductor device 100 according to a first embodiment. The semiconductor device 100 of this example has a semiconductor substrate 10. The semiconductor substrate 10 may also be referred to as a semiconductor chip. The semiconductor substrate 10 may be a rectangular shape having peripheral ends in the X direction and the Y direction. Further, the semiconductor substrate 10 may have the front surface in the +Z direction and the back surface in the −Z direction.

In this example, the X direction and the Y direction are directions perpendicular to each other. Further, the Z direction is a direction perpendicular to the X-Y plane. The X, Y, and Z directions form the so-called right-handed system. The semiconductor substrate 10 of this example has the front surface on an end in the +Z direction and the back surface on an end in the −Z direction. Note that in this example the representation of 'above' and 'below' is merely a convenient expression for describing the relative positional relation. The Z direction does not necessarily mean the gravity direction or a direction perpendicular to the ground. Note that in this example the Z direction may be referred to as the depth direction in the semiconductor substrate 10.

The semiconductor substrate 10 has an active portion 70, an edge termination portion 80, and a pad portion 90. The active portion 70 may have a plurality of transistor regions and a plurality of diode regions. The active portion 70 of this example has IGBT regions 72 as the transistor regions, FWD regions 74 as the diode regions, and a temperature detecting diode 76. The IGBT regions 72 may have one or more IGBTs, and the FWD regions 74 may have one or more FWDs. The semiconductor device 100 of this example is an RC-IGBT (Reverse Conducting IGBT) that is integrated the IGBT regions 72 and the FWD regions 74 into the semiconductor substrate 10.

A plurality of IGBT regions 72 may be provided so as to be spaced apart each other in the X direction and the Y direction. In addition, a plurality of FWD region 74 may be similarly provided so as to be spaced apart each other in the X direction and the Y direction. Note that in the X direction the FWD regions 74 may be arranged to be sandwiched with two IGBT regions 72. Note that in the Y direction the IGBT regions 72 may be adjacent to each other, and the FWD regions 74 may be adjacent to each other. Note that in FIG. 1 the FWD regions 74 are hatched.

In this example, the temperature detecting diode 76 is provided at the central portion of the semiconductor substrate 10. When a certain current flows in the temperature detecting diode 76, a voltage difference between a cathode and an anode may vary depending on the temperature of the semiconductor substrate 10. Thus, it is possible to detect the temperature of the semiconductor substrate 10 by using the temperature detecting diode 76.

In this example, five IGBT regions 72 and four FWD regions 74 are provided in the X direction at the position in the +Y direction from the central portion (first row). In addition, six IGBT regions 72 and four FWD regions 74 are provided in the X direction at the position of the central portion (second row) and at the position in the −Y direction from the central portion (third row), respectively.

Note that, in this example, two IGBT regions 72 in the second row sandwiching the temperature detecting diode 76 between them in the X direction and two IGBT regions 72 in the third row adjacent in the −Y direction of the two IGBT regions 72 in the second row, are smaller regions in area than IGBT regions 72 other than these four IGBT regions 72. One of the reasons why the area is smaller may be for providing the temperature detecting diode 76 and wirings extending the cathode and anode to the pad portion 90.

The active portion 70 has a gate runner 51 on the front surface of the semiconductor substrate 10. The gate runner 51 may be provided to surround perimeters of the first row, second row, and third row of the IGBT regions 72 and the FWD regions 74, respectively. The gate runner 51 may supply a gate potential supplied from a gate pad 92 in the pad portion 90 to gate conductive portions of the IGBT regions 72.

The pad portion 90 of this example is adjacent in the −Y direction of the active portion 70. The pad portion 90 of this example has the gate pad 92, a sense-IGBT ($S_{IGBT}$) 93, a sense-emitter pad ($S_E$) 94, an anode pad ($T_A$) 96, and a cathode pad ($T_K$) 98. In this example, the cathode pad 98, the anode pad 96, the gate pad 92, the sense-IGBT 93, and the sense-emitter pad 94 are arranged in this order in the X direction. Note that the sense-IGBT ($S_{IGBT}$) 93 is not a pad, but an IGBT. Each pad may be an electrode pad including such as gold (Au), silver (Ag), copper (Cu), or Aluminum (Al).

The sense-IGBT 93 is an IGBT provided for the purpose of detecting a main current flowing in the IGBT regions 72. It is possible to detect the main current flowing in the IGBT regions 72 by taking a sense-current flowing in the sense-IGBT 93 into a control circuit provided outside of the semiconductor device 100. Note that the sense-current has a current value sufficiently smaller than the main current. The sense-emitter pad 94 of this example has the same potential as the emitter of the sense-IGBT 93. The sense-current may be taken into the above-described control circuit from the sense-emitter pad 94 via the sense-IGBT 93. The control circuit may detect the main current based on the sense-current and, if an excessive current is flowing in the IGBT regions 72, interrupt the current flowing in the IGBT regions 72.

The anode pad 96 is an anode pad to electrically connect to the temperature detecting diode 76, and has the anode potential of the temperature detecting diode 76. Similarly, the cathode pad 98 is a cathode pad to electrically connect to the temperature detecting diode 76, and has the cathode potential of the temperature detecting diode 76. It is possible to detect a potential difference between the anode and the cathode of the temperature detecting diode 76 by using the anode pad 96 and cathode pad 98.

The edge termination portion 80 may be provided in the peripheral portion of the semiconductor substrate 10. The edge termination portion 80 of this example is provided around the end of the semiconductor substrate 10 to surround the active portion 70 and the pad portion 90. The edge termination portion 80 may have a function to relax the electric field crowding in the vicinity of the front surface of the semiconductor substrate 10 in the active portion 70. The edge termination portion 80 may have guard rings, a field plate, a RESURF structure, a channel stopper, or combined structures thereof.

Figure 2:
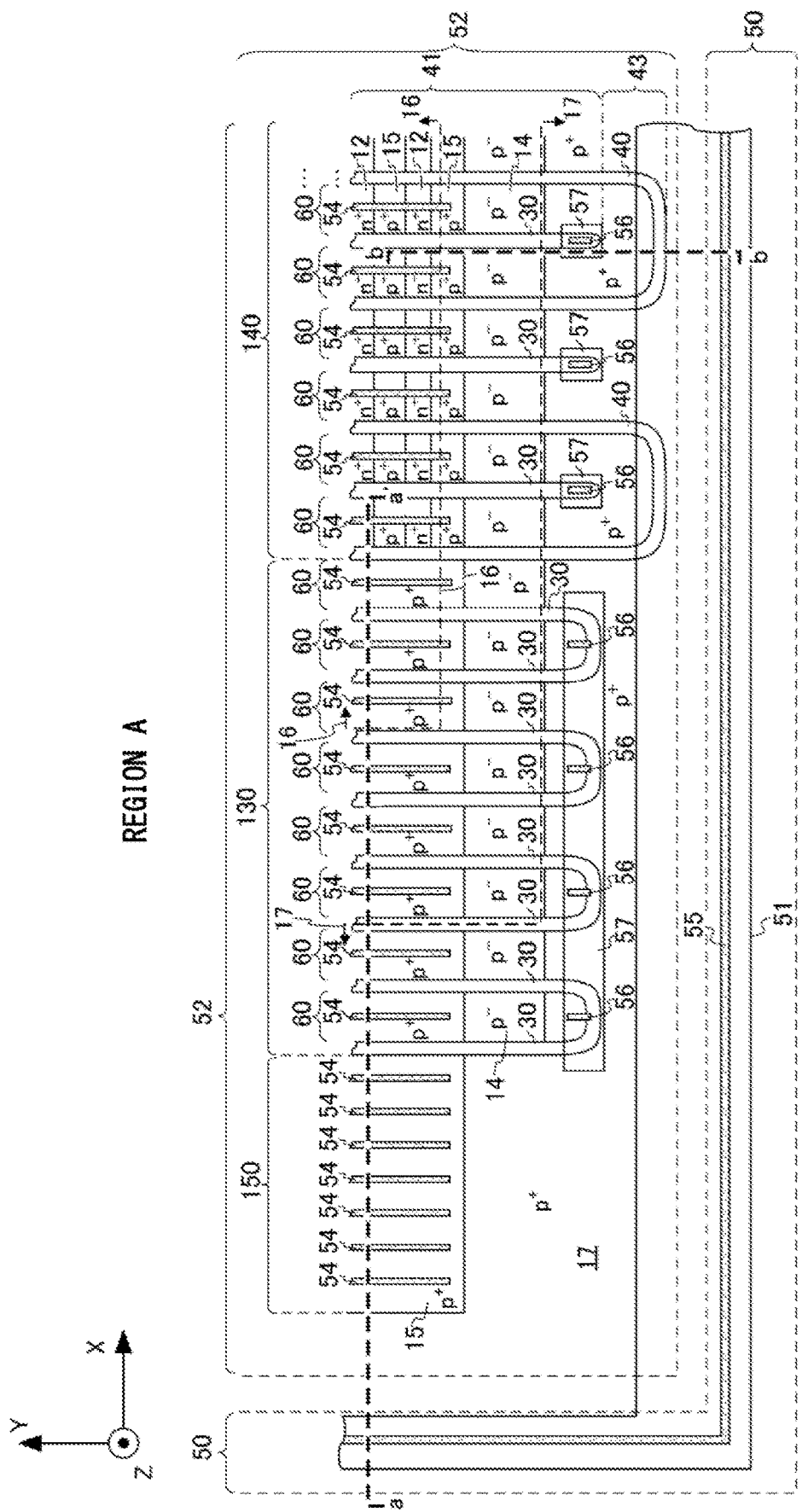
FIG. 2 is an enlarged view of the region A.

FIG. 2 is an enlarged view of the region A. The region A is a region including the IGBT region 72 and the gate runner 51 of the active portion 70. Note that in consideration of visibility of the drawing, the edge termination portion 80 and the pad portion 90 are omitted in FIG. 2.

The semiconductor device 100 of this example includes emitter regions 12, base regions 14, contact regions 15, a well region 17, dummy trench portions 30, and gate trench portions 40, which are formed on the front surface of the semiconductor substrate 10 and inside the vicinity of the front surface. Also, the semiconductor device 100 of this example includes an emitter electrode 52 and a gate metal layer 50, which are provided above the front surface of the semiconductor substrate 10. The emitter electrode 52 and the gate metal layer 50 are provided to be electrically separated from each other.

An interlayer dielectric film is formed between the emitter electrode 52 and gate metal layer 50 and the front surface of the semiconductor substrate 10, but the film is omitted in FIG. 2. The interlayer dielectric film of this example has contact-holes 54, 55, and 56 formed through the interlayer dielectric film. Note that in FIG. 2 contact-holes 54, 55, and 56 are illustrated.

The emitter electrode 52 contacts with the emitter regions 12 and the contact regions 15 on the front surface of the semiconductor substrate 10 through the contact-holes 54. Between the emitter electrode 52 and the contact regions 15, plugs such as tungsten may also be provided.

In addition, the emitter electrode 52 connects with dummy conductive portions within the dummy trench portions 30 through the contact-holes 56. In Z direction, connecting portions 57 formed of a material having conductivity such as polysilicon doped with impurities may be provided between the emitter electrode 52 and the dummy conductive portions. The connecting portions 57 are formed on the front surface of the semiconductor substrate 10.

The gate metal layer 50 contacts with the gate runner 51 through the contact-hole 55. The gate runner 51 may be formed of polysilicon doped with impurities, or the like. The gate runner 51 connects with the gate conductive portions within the gate trench portions 40 on the front surface of the semiconductor substrate 10. That is, the gate runner 51 is formed, on the front surface of the semiconductor substrate 10, spanning between a portion of the gate trench portion 40 and the contact-hole 55.

The emitter electrode 52 and the gate metal layer 50 are formed of a metal-containing material. For example, at least some regions of each electrode are formed of aluminum or an aluminum-silicon alloy. Each electrode may also include a barrier-metal formed of titanium, a titanium compound, or the like in a lower layer of the regions formed of aluminum or the like.

The IGBT regions 72 of this example include a dummy trench region 130, a mixed trench region 140, and a well-contact region 150. The dummy trench region 130 is a region only having the dummy trench portions 30 as trench portions. The dummy trench region 130 is provided between the gate trench portion 40 closest to the edge termination portion 80 and the edge termination portion 80. The dummy trench region 130 has the plurality of dummy trench portions 30 arranged so as to be spaced a predetermined interval apart in the X direction.

The mixed trench region 140 is a region having the dummy trench portions 30 and the gate trench portions 40. The mixed trench region 140 is located inside the dummy trench region 130. Note that the term "inside" in this example means the central portion side of the front surface of a two-dimensional plane (the portion provided with the temperature detecting diode 76 in FIG. 1). That is, the term "inside" means being closer to the central portion than the edge termination portion 80. The term "outside" is used as an opposite meaning of the "inside". For example, the term "outside" means being close to the end of the semiconductor substrate 10. In FIG. 1, the mixed trench region 140 is located innermost in the X direction, and the edge termination portion 80 is located outermost in X direction. Note that the term "inside" and "outside" may be used about the X direction and the Y direction.

The mixed trench region 140 has the plurality of gate trench portions 40 and the plurality of dummy trench portions 30 arranged at a predetermined interval along a predetermined array direction. Note that in this example the array direction is the X direction. In the mixed trench region 140, the dummy trench portions 30 and the gate trench portions 40 are provided alternately in the X direction.

In this example, a spaced distance between the dummy trench portions 30 adjacent in the X direction in the dummy trench region 130 and a spaced distance between the dummy trench portions 30 and the gate trench portions 40 adjacent in the X direction in the mixed trench region 140 are equal to each other. The spaced distance is also equal to a spaced distance in the X direction between the dummy trench portion 30 located innermost in the dummy trench region 130 and the gate trench portion 40 located outermost in the mixed trench region 140.

In the dummy trench region 130 in FIG. 2, a total of eight dummy trench portions 30 with the ends coupled per two are arranged in the X direction. On the other hand, in the mixed trench region 140, the gate trench portions 40 and the dummy trench portions 30 are arranged alternately one by one in the X direction. In FIG. 2, the mixed trench region 140 has three dummy trench portions 30 and four gate trench portions 40 with the ends coupled per two.

In this example, a part of the dummy trench portion 30 in the dummy trench region 130 has linear shapes extending in a predetermined extending direction (the Y direction in this example) on the front surface of the semiconductor substrate 10. In addition, other part of dummy trench portions 30 in the dummy trench region 130 have a curved shape at which two straight lines are connected at their ends with the curved portion. In this example, the other parts have a U-shape. On the other hand, the dummy trench portions 30 of the mixed trench region 140 only have a linear shape extending in a predetermined extending direction. Each of the dummy trench portions 30 of the dummy trench region 130 and the mixed trench region 140 may have the same length in the Y direction.

The gate trench portions 40 of this example have opposing portions 41 and protruding portions 43. The opposing portions 41 extend in the Y direction in a range where they are opposed to dummy trench portions 30 in the IGBT regions 72. That is, the opposing portions 41 are provided to be parallel with the dummy trench portions 30. The protruding portions 43 further extend from the opposing portion 41 in the −Y direction to be provided in a range where they are not opposed to the dummy trench portions 30. In this example, two opposing portions 41 provided at both sides of the dummy trench portion 30 connect to one protruding portion 43. At least a part of the protruding portions 43 may have a curved shape. The protruding portions 43 of this example have a U-shape.

In the protruding portions 43, the gate conductive portions within the gate trench portions 40 and the gate runner 51 are connected in the Z direction. The gate runner 51 may connect to the gate conductive portion in the region furthest from the opposing portion 41 in the protruding portion 43. The protruding portion 43 of this example has a portion extending in the X direction, which is the direction perpendicular to the opposing portion 41, in the region furthest from the opposing portion 41. The gate runner 51 may connect to the gate conductive portion in the portion of the protruding portion 43.

The well-contact region 150 is provided in the vicinity of the front surface of the well region 17. The well-contact region 150 has the contact regions 15. On the contact regions 15 of the well-contact region 150, contact-holes 54 are provided, which are openings of the interlayer dielectric film. The contact regions 15 contact directly to the emitter electrode 52 through a plurality of contact-holes 54. The well-contact region 150, for example, has a function to extract holes injected from the collector region 22, to the emitter electrode 52, as described below. Note that in this example the well-contact region 150 is not essential, and it may be omitted.

The emitter electrode 52 is provided above the dummy trench region 130, the mixed trench region 140, and the well-contact region 150. The emitter electrode 52 is provided above the gate trench portions 40, the dummy trench portions 30, the well region 17, the emitter regions 12, the base regions 14, and the contact regions 15.

The well region 17 is formed in a predetermined range from the outer end of the active portion 70 of the side at which the gate metal layer 50 is provided. An inner end of the well region 17 is illustrated by a dotted line. The depth of the well region 17 may be deeper than the bottoms of the gate trench portions 40 and the dummy trench portions 30. Some regions of the gate trench portions 40 and the dummy trench portions 30 at the gate metal layer 50 side are formed in the well region 17. In an extending direction of the dummy trench portions 30, the bottom of the outer end may be covered with the well region 17.

The entire protruding portions 43 of the gate trench portions 40 may be formed in the well region 17. The semiconductor substrate 10 has the first conductivity-type, and the well region 17 may have the second conductivity-type different from the semiconductor substrate 10. The semiconductor substrate 10 of this example is an n$^-$ type substrate, and the well region 17 is a p$^+$ type region. In this example, the first conductivity-type is described as an n type, and the second conductivity-type is described as a p type. Note that in another example the first conductivity-type and the second conductivity-type may also be opposite conductivity-types from those in the above example.

Mesa regions 60 are provided between each of the plurality of dummy trench portions 30 and between the dummy trench portions 30 and the gate trench portions 40. Note that, in the semiconductor device 100, the mesa regions 60 do not protrude above each trench portion in the +Z direction, because conductive materials or the like are filled in the dummy trench portions 30 and the gate trench portions 40. However, if the conductive material or the like in the trenches is removed, the mesa regions 60 can be considered as mountains protruding in the +Z direction and being sandwiched between the trenches that are valleys. Thus, in this example, the region between the trenches is referred to as the mesa region 60.

In the mesa regions 60, the base regions 14 are formed. The base regions 14 are second conductivity-type regions in which the impurity concentration is lower than that in the well region 17. The base regions 14 of this example are p$^-$ type regions. Note that some of the base regions 14 are provided below the emitter regions 12 and the contact regions 15. In the example in FIG. 2, the base regions 14 are exposed on a part of the outside of the mesa regions 60 (in the vicinity of the connecting portion 57).

In the mesa regions 60, the contact regions 15 with the second conductivity-type having higher impurity concentration than the base regions 14, are selectively provided on a part of the front surface side from the base regions 14. The contact regions 15 of this example are p$^+$ type regions. Further, in the mixed trench region 140, the emitter regions 12 with the first conductivity-type, whose impurity concentration is higher than that in the semiconductor substrate 10, are selectively provided on a part of the front surface side from the base regions 14. The emitter regions 12 of this example are n$^+$ type regions.

In the mixed trench region 140, the respective contact regions 15 and the respective emitter regions 12 are formed from one of the trench portions adjacent in the X direction to the other of the trench portions. The contact regions 15 and the emitter regions 12 in the mixed trench region 140 are alternately exposed on the front surface of the mesa regions 60, along the extending direction of the trench portion. In the Y direction, in further outside from the outermost contact regions 15, the base regions 14 are exposed on the front surface of the mesa regions 60. Further, in the Y direction, in the outside from the base regions 14, the well regions 17 are exposed on the front surface of the mesa regions 60.

In the dummy trench region 130, the contact region 15 is formed from one of the dummy trench portions 30 adjacent in the X direction to the other of dummy trench portions 30. In the dummy trench region 130, the contact regions 15 are exposed on the front surface of the mesa regions 60, from the inside in the Y direction to the Y direction position of the outermost contact region 15 in the mixed trench region 140. Like the mixed trench region 140, the base regions 14 and well regions 17 are exposed to the front surface of the mesa regions 60 in further outside of the outermost contact region 15.

In this example, because the mesa regions 60 in the dummy trench region 130 include the contact regions 15, it becomes easier to extract holes, compared with the case where the contact regions 15 are not included. Thus, it is possible to prevent the well region 17 (in particular, the curved portion of the well region 17 in the depth direction) from being destroyed by avalanche breakdown of the p$^+$ type well region 17 and current crowding thereafter.

In the mixed trench region 140 and the dummy trench region 130, the contact-holes 54 are provided on respective regions of the contact regions 15 and the emitter regions 12. The contact-holes 54 are not provided on the region corresponding to the base regions 14 and the well regions 17.

Further, in this example, the accumulation regions 16 with the first conductivity-type are provided below the emitter regions 12 and the contact regions 15 in the mixed trench region 140. The outer end of the accumulation region 16 is shown by a dashed line. The accumulation regions 16 of this example are n$^+$ type regions. The accumulation regions 16 of this example may accumulate donors in higher concentration than the drift region. The accumulation regions 16 enable so-called IE effect to be enhanced. Further, the accumulation regions 16 may be provided below at least some of the contact regions 15 in the dummy trench region 130. In this example, the accumulation regions 16 are provided from the inside of the dummy trench region 130 in the X direction to the third dummy trench portion 30.

Thus, in this example, the dummy trench region 130 is provided outside of the gate trench portions 40, and the accumulation regions 16 are further provided in the mesa regions 60 in a part of dummy trench region 130. Therefore, even if an end of a mask for forming the accumulation region 16 by ion implantation sags, the sagged position can be located on the dummy trench region 130 rather than on the mixed trench region 140. Thus, even if the accumulation regions 16 provided in the mesa regions 60 of the dummy trench region 130 are not formed at the predetermined depth position, the accumulation regions 16 provided in the mesa regions 60 of the mixed trench region 140 can be formed in the predetermined depth. This enables variation of the gate threshold voltage (Vth) and variation of the saturation current between the gate trench portions 40 to be suppressed.

Figure 3:
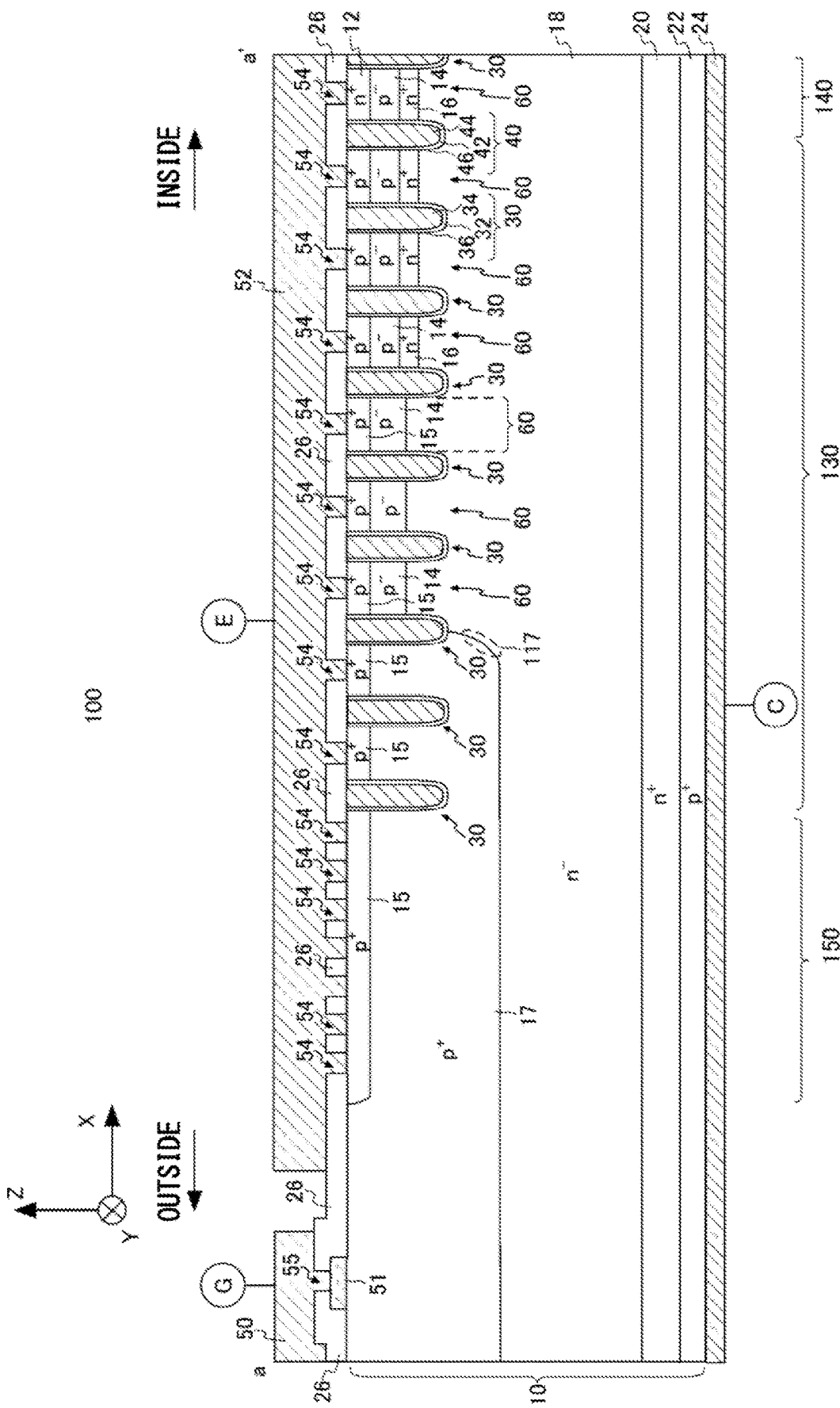
FIG. 3 is a cross-sectional view taken along a-a' in the FIG. 2.

FIG. 3 is a cross-sectional view taken along a-a' in FIG. 2. The cross section taken along a-a' is parallel to the X-Z plane and is a cross section through the range spanning from the edge termination portion 80 to the mixed trench region 140.

The semiconductor device 100 of this example includes such as a semiconductor substrate 10, an interlayer dielectric film 26, a gate metal layer 50, an emitter electrode 52, a collector electrode 24, in the cross section. The gate metal layer 50 and the emitter electrode 52 are formed on the front surface of the semiconductor substrate 10 and the upper surface of the interlayer dielectric film 26. The collector electrode 24 is provided on the back surface of the semiconductor substrate 10 contacting directly thereon.

The gate metal layer 50, the emitter electrode 52, and the collector electrode 24 are formed with a conductive material such as metal. Further, in this specification, the surface of the emitter electrode 52 side of each member such as a substrate, a layer, a region, is referred to as the front surface, and the surface of the collector electrode 24 side of those is referred to as the back surface.

The semiconductor substrate 10 may be a silicon substrate, may be a silicon carbide substrate, may be a nitride semiconductor substrate such as gallium nitride, or the like. Note that the semiconductor substrate 10 of this example is a silicon substrate. The $p^-$ type base regions 14 are formed in the vicinity of the front surface of the semiconductor substrate 10.

In the cross section, in the vicinity of the front surface of the mesa regions 60 in the mixed trench region 140, $n^+$ type emitter regions 12, $p^-$ type base regions 14, and $n^+$ type accumulation regions 16 are provided in this order in the direction from the front surface of the semiconductor substrate 10 toward the back surface. Note that, in the vicinity of the front surface of the mesa regions 60 in the dummy trench region 130, contact regions 15 and the base regions 14 are provided in this order in the direction from the front surface toward the back surface.

The accumulation regions 16 may be provided below at least some of the mesa regions 60 in the dummy trench region 130. In the dummy trench region 130 of this example, the mesa regions 60 ranging from the inside of the dummy trench portion 30 located innermost to the third dummy trench portion 30 include the accumulation regions 16 below the base regions 14.

On the other hand, the accumulation region 16 may not be provided below at least one mesa region 60 of the mesa regions 60 in the dummy trench region 130. In the dummy trench region 130 of this example, the mesa regions 60 outside from the dummy trench portion 30 located third from the innermost do not include the accumulation regions 16 below the base regions 14. The accumulation regions 16 have a function for accumulating holes injected from the collector region 22. It is possible to increase the carrier injection-enhancement effect (IE effect) and reduce the on-voltage by providing the accumulation regions 16.

In this example, the accumulation regions 16 are not provided intentionally in some of the mesa regions 60 of the dummy trench region 130. Due to this, it becomes easier to extract holes from the mesa regions 60, compared with the case where the accumulation regions 16 are provided in all of the mesa regions 60. Thus, it is possible to prevent the well region 17 (in particular, the curved portion 117 of the well region 17 in the depth direction) from being destroyed by avalanche breakdown of the $p^+$ type well region 17 and current crowding thereafter.

The well region 17 may cover the bottoms of two or more dummy trench portions 30 among the plurality of dummy trench portions 30. The well region 17 of this example covers the bottoms of two dummy trench portions 30 located outermost in the X direction. By providing the dummy trench portions 30 having the emitter potential in the well region 17, compared with the case where the dummy trench portions 30 are not provided in the well region 17, it becomes easier to extract holes from the drift region 18 via the well region 17 to the emitter electrode 52. This allows the turn-off power loss to be reduced.

In this example, the mesa regions 60 not including the accumulation regions 16 are provided between the well region 17 and the mesa regions 60 including the accumulation regions 16. The mesa regions 60 not including the accumulation regions 16 serve as margin regions preventing n type impurity regions to be formed mistakenly in the well region 17 when the $n^+$ type accumulation regions 16 are formed. If the $n^+$ type accumulation regions 16 are formed in the $p^+$ type well region 17 due to such as a misalignment of a mask preventing impurities from being implanted and a mask sag, high resistance regions are formed by carrier neutralization. It is not desirable to form the high resistance regions, because holes are hard to be extracted from the high resistance regions. In this example, it is possible to ensure that the high resistance region is not formed in the well region 17 by providing the mesa regions 60 not including the accumulation regions 16 adjacent to the well region 17.

The drift region 18 with the first conductivity-type is provided right below the dummy trench portions 30 and the gate trench portions 40, and right below the well region 17. The drift region 18 of this example is $n^-$ type whose concentration is lower than that in the $n^+$ type accumulation regions 16.

The buffer region 20 with the first conductivity-type is formed on the back surface of the drift region 18. The impurity concentration of the buffer region 20 may be higher than the impurity concentration of the drift region 18. The buffer region 20 of this example is an $n^+$ type region. The buffer region 20 may serve as a field-stop layer to prevent a depletion layer extending from the back surface of the base region 14 from reaching the $p^+$ type collector region 22.

The collector region 22 with the second conductivity-type is provided below the drift region 18 and right below the buffer region 20. The collector region 22 of this example is a p+ type region. Further, the collector electrode 24 is provided on the back surface of the collector region 22.

The dummy trench portions 30 and the gate trench portions 40 are provided in the vicinity of the front surface of the semiconductor substrate 10. Each trench portion reaches the drift region 18 through the base region 14 from the front surface of the semiconductor substrate 10. In the regions where at least any of the emitter region 12, the contact region 15, and the accumulation region 16 is provided, each trench portion also reaches the drift region 18 through these regions.

The gate trench portion 40 includes a gate trench 46, a gate insulating film 42, and a gate conductive portion 44, which are provided in the vicinity of the front surface of the semiconductor substrate 10. The gate insulating film 42 is formed to cover the inner wall of the gate trench 46. The gate insulating film 42 may be formed by oxidizing or nitriding semiconductors of the inner wall of the gate trench 46. The gate conductive portion 44 is formed on the gate insulating film 42 in the gate trench 46. That is, the gate insulating film 42 insulates the gate conductive portion 44 from the semiconductor substrate 10. The gate conductive portion 44 is formed of a conductive material such as polysilicon.

The gate conductive portion 44 is opposed to at least adjacent base region 14 in the X direction. The gate trench portions 40 are covered by an interlayer dielectric film 26 on the front surface of the semiconductor substrate 10. When a predetermined voltage is applied to the gate conductive portion 44, a channel is formed in a surface layer of an interface in contact with the gate trench 46 in the base region 14. In this example, as shown in FIG. 2, the gate conductive portion 44 in the protruding portion 43 electrically connects to the gate metal layer 50 via the gate runner 51.

The dummy trench portions 30 may have the same structure as the gate trench portions 40 in the cross section. Each dummy trench portion 30 includes a dummy trench 36, a dummy trench insulating film 32, and a dummy trench conductive portion 34, which are formed in the vicinity of the front surface of the semiconductor substrate 10. The dummy trench insulating film 32 is formed to cover the inner wall of the dummy trench 36. The dummy trench conductive portion 34 is formed on dummy trench insulating film 32 in the dummy trench 36. The dummy trench insulating film 32 insulates the dummy trench conductive portion 34 from the semiconductor substrate 10. The dummy trench conductive portion 34 may be formed of the same materials the gate conductive portion 44. The dummy trench conductive portion 34 may have the same length as the gate conductive portion 44 in the depth direction.

The dummy trench portions 30 are covered by the interlayer dielectric film 26 on the upper surface of the semiconductor substrate 10. In this example, as shown in FIG. 2, the dummy trench conductive portion 34 electrically connects to the emitter electrode 52 via the contact-hole 56. Note that, though not explicitly shown in the cross section, an insulating film such as the gate insulating film 42 is formed between the gate runner 51 and the semiconductor substrate 10. That is, the gate runner 51 is insulated from the semiconductor substrate 10 by the insulating film.

Figure 4:
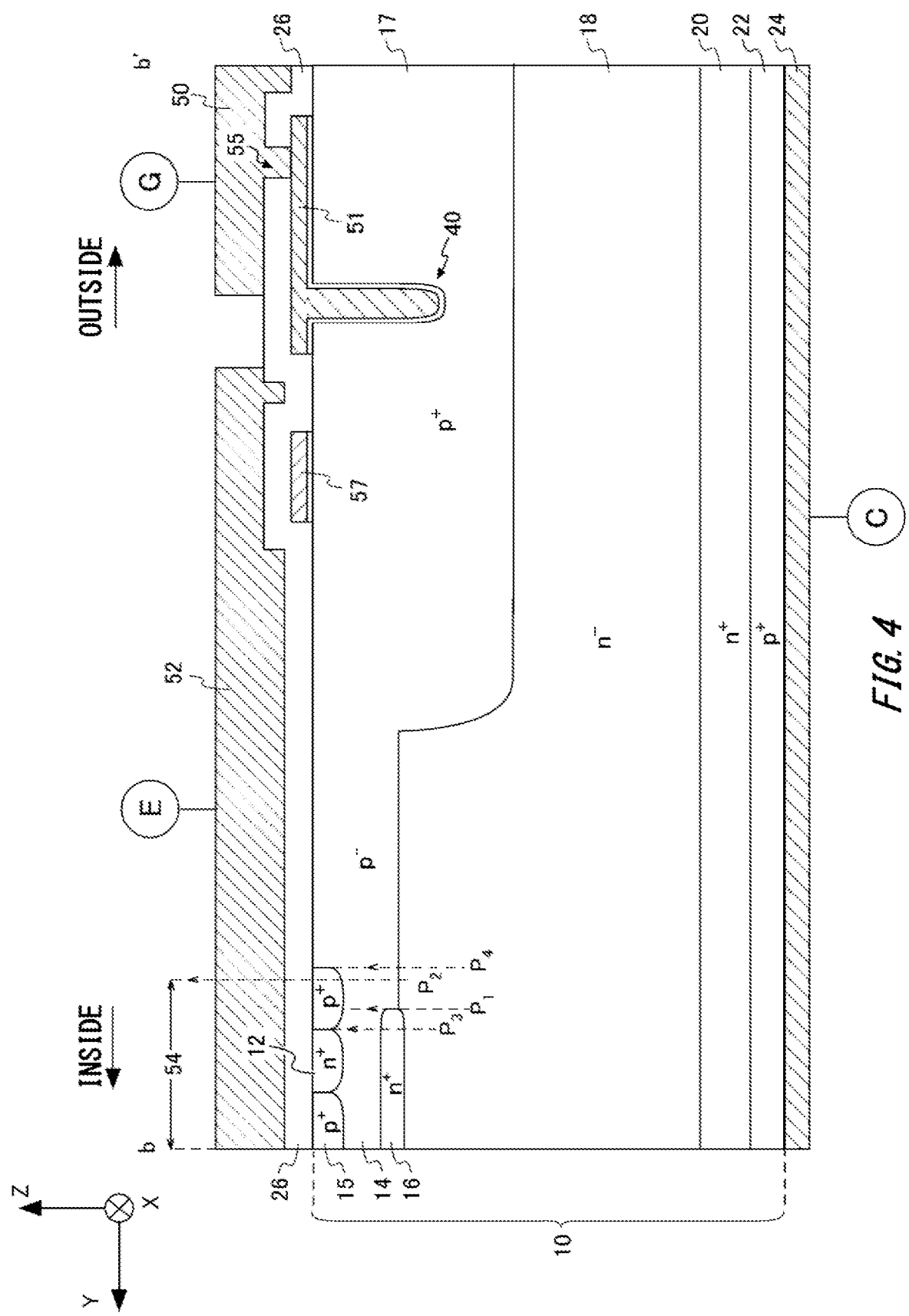
FIG. 4 is a cross-sectional view taken along b-b' in the FIG. 2.

FIG. 4 is a cross-sectional view taken along b-b' in the FIG. 2. The cross section taken along b-b' is a plane parallel to the Y-Z plane. Further, the cross section taken along b-b' is a cross section through the mesa region 60, the connecting portion 57, and the gate runner 51, of the mixed trench region 140. Note that the contact-hole 54 adjacent in the X direction is illustrated with dotted line. In the cross section, the accumulation region 16 is provided in the mesa region 60.

As shown in FIG. 2, in the front surface of the mesa regions 60, the emitter regions 12 and the contact regions 15 are alternately provided along the extending direction of the trench portion. Further, the accumulation regions 16 are provided on the underside of the base regions 14.

In the Y direction, the accumulation region 16 is preferably provided extending to the outside from the emitter region 12 formed outermost. That is, the outer end position $P_1$ of the accumulation region 16 is preferably provided in the outside from the outer end position $P_3$ of the emitter region 12. This enables the IE effect in the accumulation region 16 to be enhanced.

Further, in the Y direction, the contact-hole 54 is preferably provided extending to the outside from the accumulation region 16. That is, the outer end position $P_2$ of the contact-hole 54 is preferably disposed in the outside from the outer end position $P_1$ of the accumulation region 16. This enables holes to be extracted efficiently from the outside from the accumulation region 16, when semiconductor device 100 is turned off.

Further, the contact region 15 formed outermost in the Y direction is preferably provided extending to the outside from the contact-hole 54. That is, the outer end position $P_4$ of the contact region 15 is preferably disposed in the outside from the outer end position $P_2$ of the contact-hole 54. This enables holes to be extracted efficiently from the outside from the accumulation region 16, when semiconductor device 100 is turned off.

Further, the distance from the outer end position $P_3$ of the emitter region 12 to the outer end position $P_1$ of the accumulation region 16 may be shorter than the distance from the outer end position $P_1$ of the accumulation region 16 to the outer end position $P_4$ of the contact region 15. This enables it to be suppressed that an interference of holes being extracted by the accumulation region 16. Further, electric field crowding at an end of the accumulation region 16 can be relaxed. The distance from the position $P_3$ to $P_1$ is preferably shorter than the distance from position $P_1$ to $P_2$.

As an example, the distance from the position $P_3$ of the emitter region 12 to the position $P_1$ of the accumulation region 16 is 12 μm or less. Further, the distance from the position $P_1$ of the accumulation region 16 to the position $P_2$ of the contact-hole 54 is 20 μm or less. Further, the distance from the position $P_2$ of the contact-hole 54 to the position $P_4$ of the contact region 15 is 1 μm or less.

In addition, in the front surface of the semiconductor substrate 10, the base region 14 is formed between the outermost contact region 15 and the well region 17. In the Y direction, the length of the base region 14 between the contact region 15 and the well region 17 may be 10 μm or more and 50 μm or less.

Figure 5:
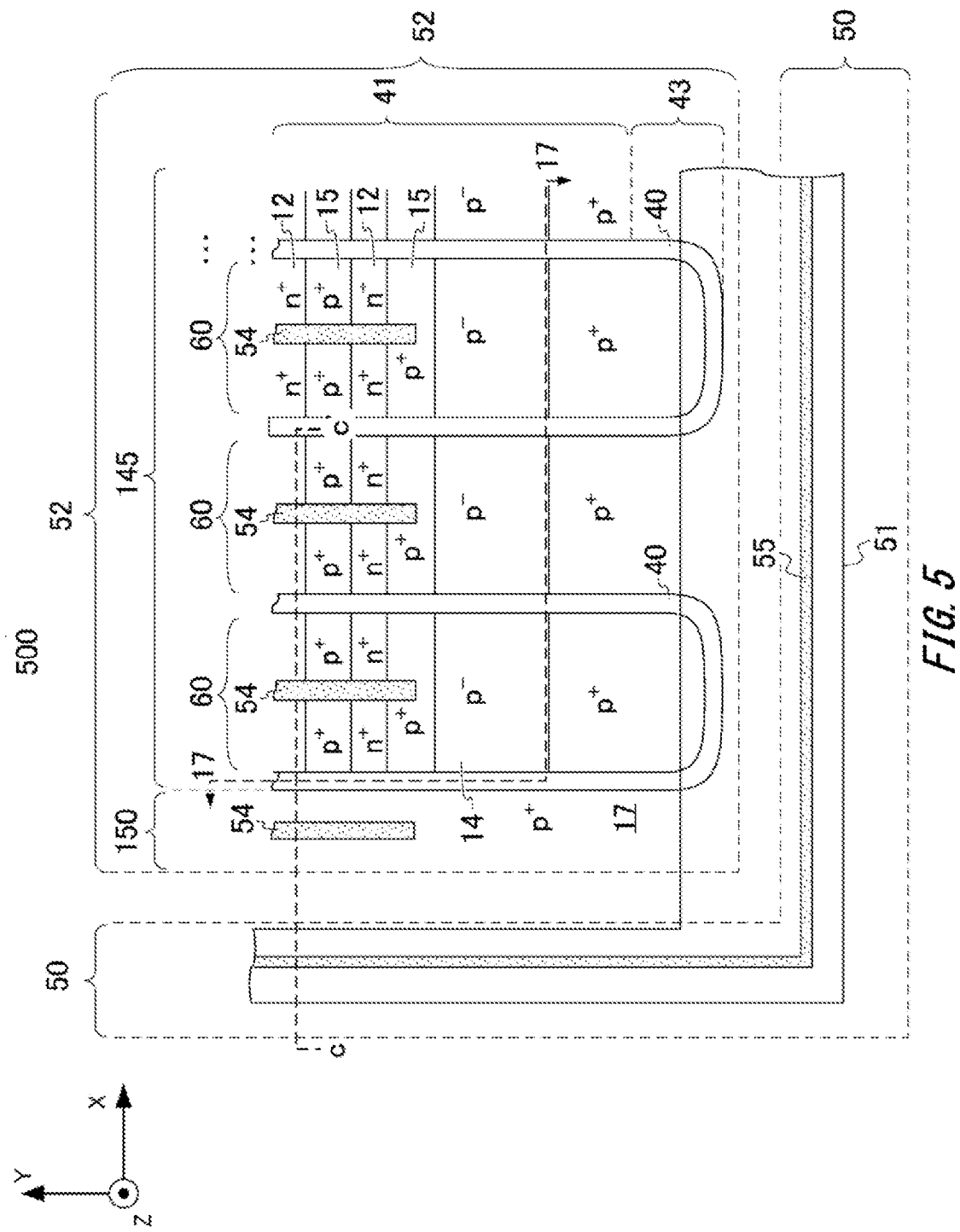
FIG. 5 is an enlarged view of the region A in a semiconductor device 500 of a comparative example.

FIG. 5 is an enlarged view of the region A in the semiconductor device 500 of a comparative example. Configurations common to the first embodiment is labeled by the same reference numerals, and description thereof is omitted. The IGBT region 72 of this example, unlike the mixed trench region 140 of the first embodiment, includes a gate trench region 145 having only the gate trench portions 40 as a trench portion. The IGBT region 72 of this example does not have the dummy trench region 130 between the gate trench region 145 and the edge termination portion 80. This point is the largest difference, compared with the first embodiment. Further, the well-contact region 150 has only one contact-hole 54 wide in the X direction compared with the first embodiment.

Figure 6:
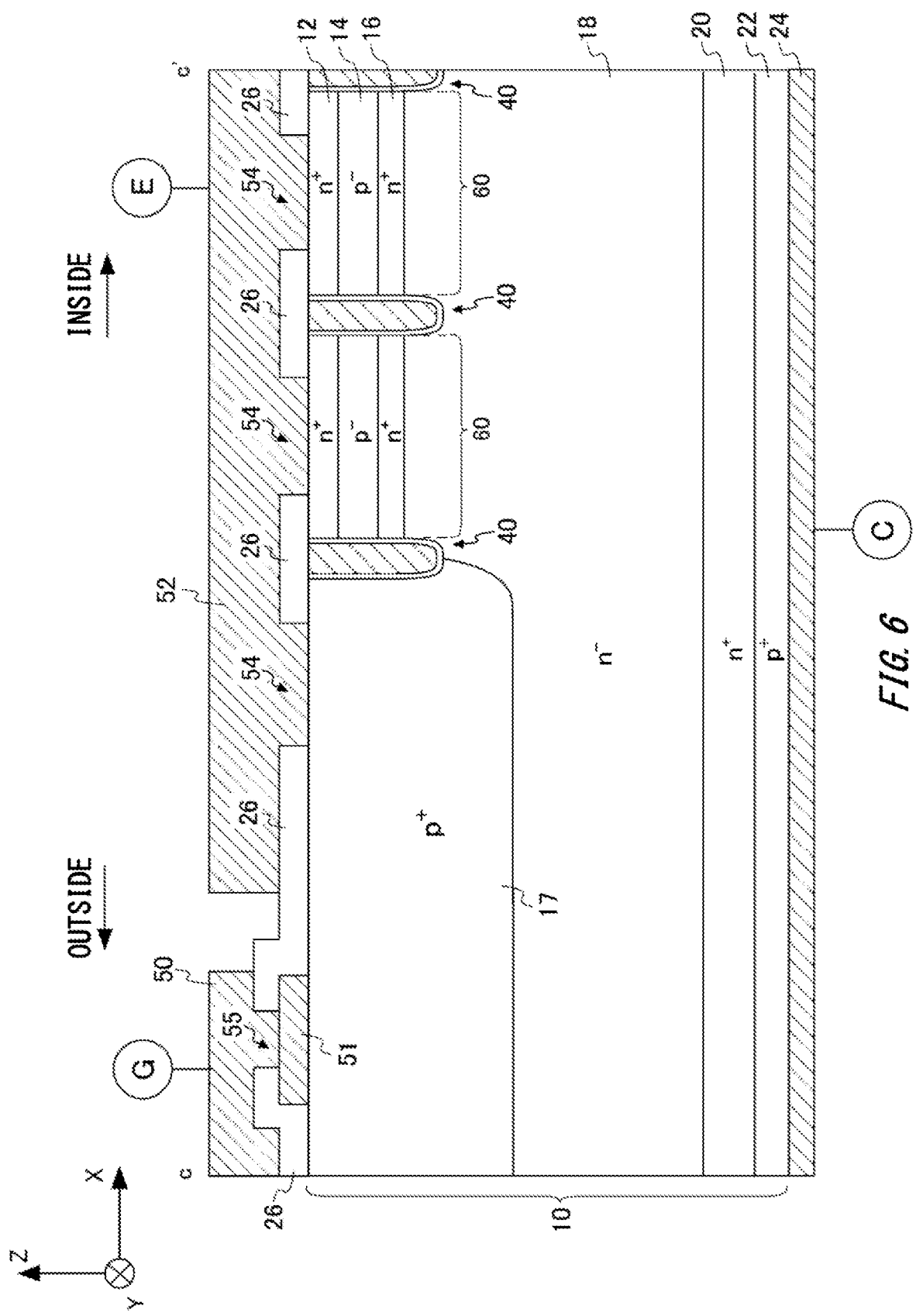
FIG. 6 is a cross-sectional view taken along c-c' in FIG. 5.

FIG. 6 is a cross-sectional view taken along c-c' in FIG. 5. Configurations common to the first embodiment is labeled by the same reference numerals, and description thereof is omitted. FIG. 6 is a diagram showing an ideal case in which a mask sag does not occur at the end of the mask used for forming the n$^+$ type accumulation regions 16. As described below, in an actual semiconductor device 500, the depth position of forming the accumulation regions 16 is shifted from the ideal depth position shown in FIG. 6 due to the mask sag.

Figure 7:
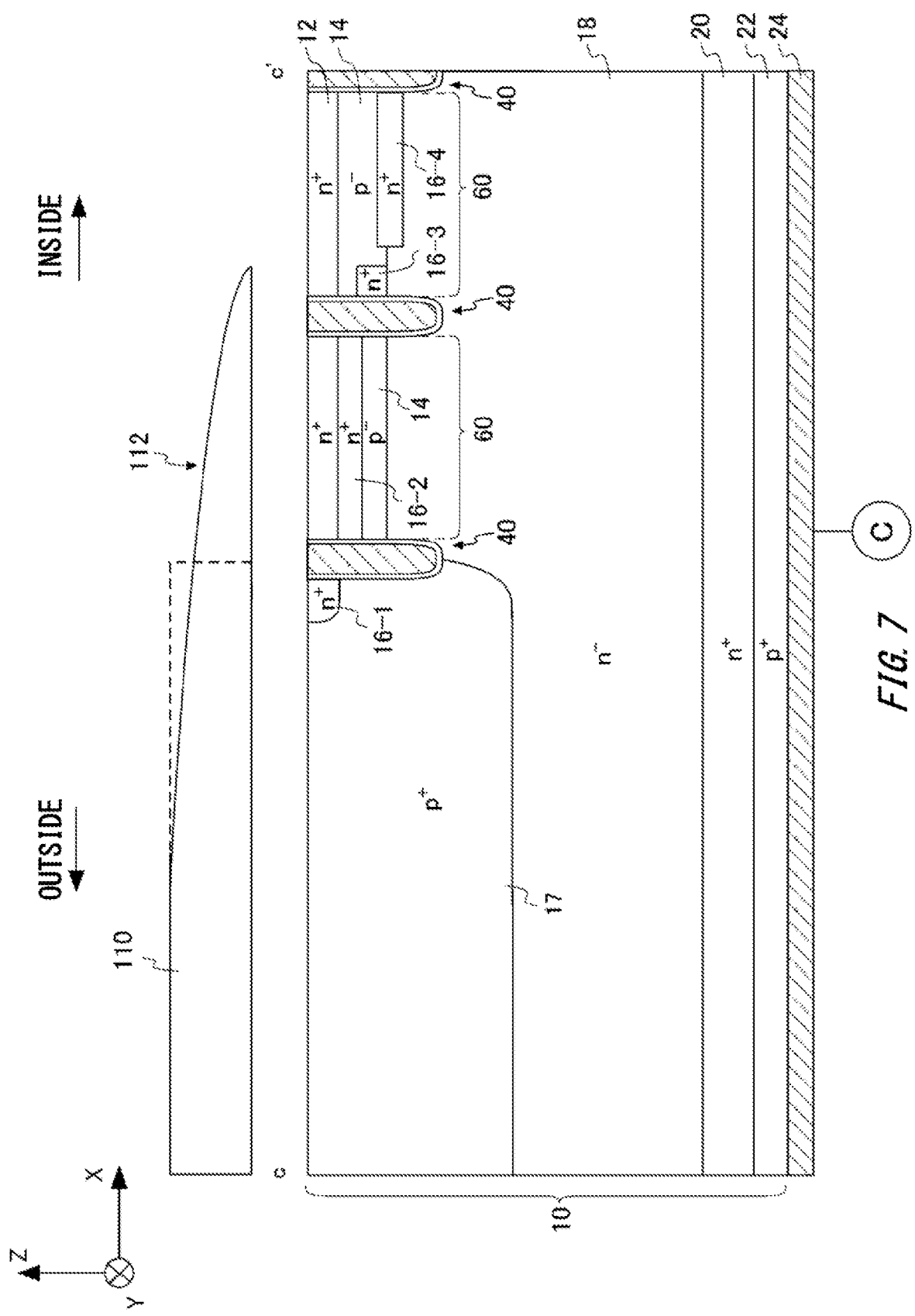
FIG. 7 is a diagram describing a mask sag in the comparative example.

FIG. 7 is a diagram describing the mask sag in the comparative example. FIG. 7 shows variation in the depth position of the accumulation regions 16 due to the mask sag. For ease of understanding, the structures on the front surface of the semiconductor substrate 10 are omitted, and the mask 110 is illustrated above the semiconductor substrate 10.

The mask 110 is used in a process for implanting n type impurities in regions corresponding to the accumulation regions 16. The mask 110 may be formed by coating a resist or the like and patterning it in a predetermined shape. The accumulation regions 16 are not formed in the region covered by the mask 110, and the accumulation regions 16 are formed in the region not covered by the mask 110.

The end of the mask 110 is preferably formed vertically right above the outermost gate trench portion 40. The ideal condition in which the end of the mask 110 is formed vertically is illustrated with the dotted line in FIG. 7. However, when the resist sag occurs in the mask 110, a mask sag region 112 may be formed right above the outermost gate trench portion 40 and further formed inside from there. When the mask sag region 112 is formed, the accumulation regions 16 are not formed at the predetermined depth in the mesa regions 60 covered by the mask sag region 112. For example, in the mesa region 60 covered by the mask sag region 112, the accumulation regions 16 are formed to be shallower than the predetermined depth.

The accumulation regions 16 of this example include accumulation regions 16-1 to 16-4. The accumulation region 16-1 is formed in the vicinity of the front surface of the p$^+$ type well region 17. The accumulation region 16-2 is formed between the emitter region 12 and the base region 14 at a deeper position than the accumulation region 16-1. The accumulation region 16-3 is formed in the base region 14 at a deeper position than the accumulation region 16-2. The accumulation region 16-4 is formed at the predetermined depth position at a deeper position than the accumulation region 16-3.

Each accumulation region 16-1 to 16-4 may be formed gradually deeper as approaching inside. The accumulation region 16-3 and the accumulation region 16-4 may also be formed continuously and may be formed discontinuously in the depth direction.

As the depth position of the accumulation region 16 varies, the length in the depth direction of the base region 14 in the mesa region 60 varies. Due to this, when the gate trench portion 40 is provided adjacent to the mesa region 60, there is an issue that the gate threshold voltage (Vth) of the mesa region 60 varies with respect to the gate threshold voltage of other mesa regions 60, so that variation in the gate threshold voltage increases. Further, there is another issue that variation in the saturation current in the IGBT region 72 increases. In addition, as described above, the n$^+$ type accumulation region 16-1 formed in the well region 17 results in a high resistance region.

On the other hand, in the semiconductor device 100 of the first embodiment, the dummy trench region 130 is provided between the gate trench portions 40 and the well region 17. The length at which the resist sag occurs is, for example, is the length of two or more and three or less of the width of the mesa region 60 in the X direction. In the first embodiment, six dummy trench portions 30 (that is, six mesa regions 60) are provided between the outermost gate trench portion 40 and the well region 17. Due to this, since accumulation regions 16 with their depth position varying result in being formed only in the dummy trench region 130 that does not contribute to on/off operations of a gate, such as variation in the gate threshold voltage and the saturation current can be reduced.

Figure 8:
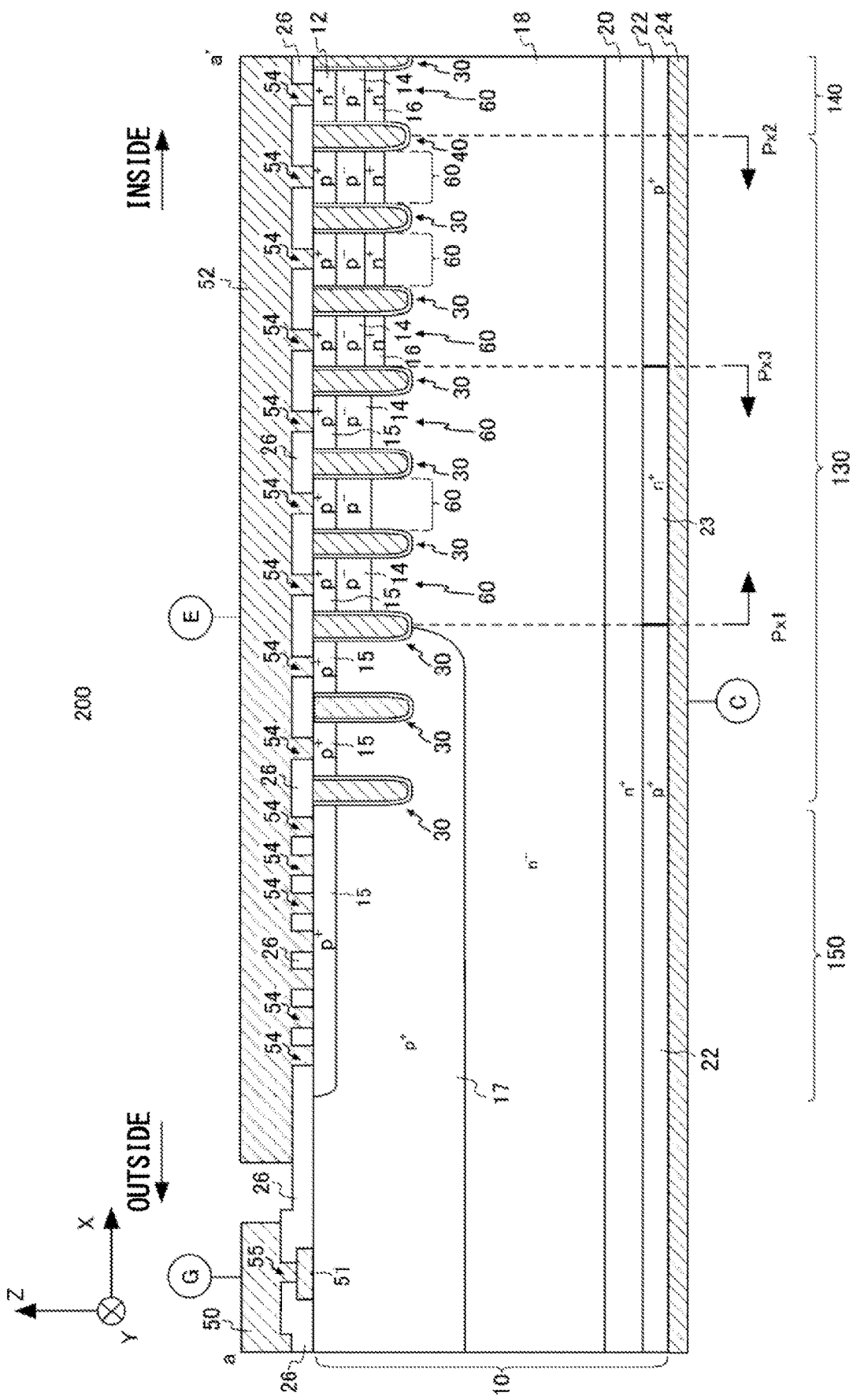
FIG. 8 is a cross-sectional view taken along a-a' of a semiconductor device 200 according to a second embodiment.

FIG. 8 is a cross-sectional view taken along a-a' of a semiconductor device 200 according to a second embodiment. FIG. 8 corresponds to FIG. 3 which is the cross section taken along a-a' of the first embodiment. The semiconductor device 200 of this example includes an opposite conductivity-type semiconductor region 23 with the first conductivity-type in the same depth range as the collector region 22. The opposite conductivity-type semiconductor region 23 of this example is a semiconductor region with opposite conductivity-type to the collector region 22. The second embodiment is different from the first embodiment in this point. Since other points are common to the first embodiment, such overlapped descriptions are omitted. The opposite conductivity-type semiconductor region 23 of this example is an n$^+$ type region that has higher concentration than the drift region 18.

The opposite conductivity-type semiconductor region 23 may be provided in place of a partial region in the X and Y directions of the collector region 22 in the same depth range as the collector region 22. By using a part of the collector region 22 as the opposite conductivity-type semiconductor region 23, the amount of holes injected from the collector region 22 to the well region 17 can be reduced. This can prevents the well region 17 from being destroyed due to avalanche breakdown of the well region 17 and current crowding thereafter.

The opposite conductivity-type semiconductor region 23 may be provided continuously in the X direction from the inner end Px1 of the well region 17 to the central portion Px2 at the bottom of the gate trench portion 40. The opposite conductivity-type semiconductor region 23 of this example is provided continuously in the X direction from the inner end Px1 of the well region 17 to the outer end Px3 of the mesa regions 60 where the accumulation regions 16 are provided. Due to the arrangement of the opposite conductivity-type semiconductor region 23 of this example, it is possible to avoid current crowding to the well region 17 by the opposite conductivity-type semiconductor region 23, while maximally maintaining the effective area of the collector region 22 contributing to the hole injection. Note that, though not explicitly shown in the cross section, an insulating film such as the gate insulating film 42 is formed between the gate runner 51 and the semiconductor substrate 10. That is, the gate runner 51 is insulated from the semiconductor substrate 10 by the insulating film.

Figure 9:
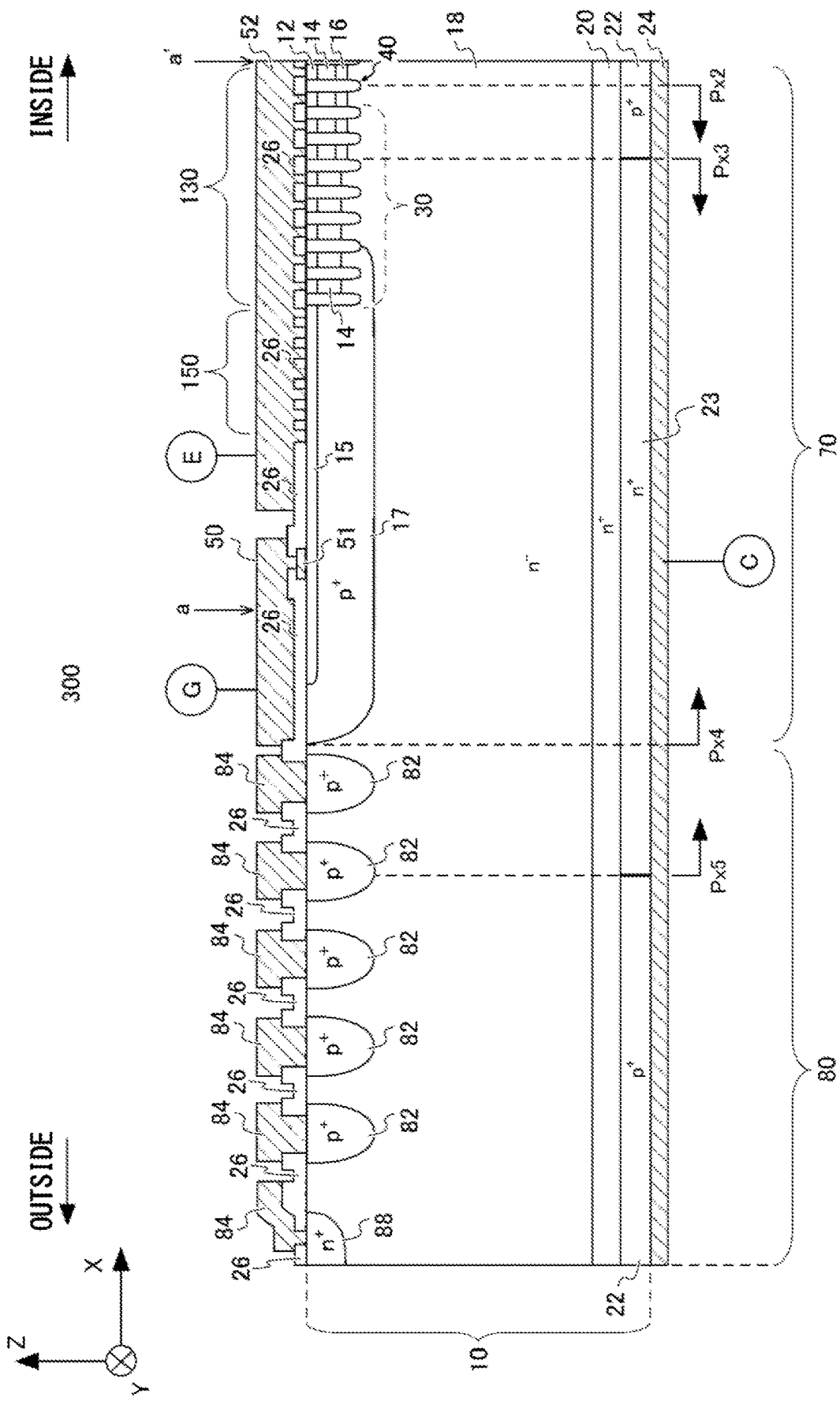
FIG. 9 is a cross-sectional view of regions spanning an active portion 70 and an edge termination portion 80 in a semiconductor device 300 according to a third embodiment.

FIG. 9 is a cross-sectional view of regions spanning an active portion 70 and an edge termination portion 80 in a semiconductor device 300 according to a third embodiment. In FIG. 9, the edge termination portion 80 is shown together in this example, in addition to the cross-sectional view taken along a-a' in FIG. 2. The edge termination portion 80 of this example includes a guard ring structure and a channel stopper structure.

The guard ring structure may include a plurality of guard rings 82. The guard ring structure of this example includes five guard rings 82. Each guard ring 82 may be provided in the front surface to surround the active portion 70 and the pad portion 90.

The guard ring structure may have a function to extend the depletion layer, which has been generated in the active portion 70, to the outside of the semiconductor substrate 10. This allows preventing electric field crowding inside the semiconductor substrate 10. Therefore, it is possible to improve the breakdown voltage of the semiconductor device 300, compared with the case where the guard ring structure is not provided.

The guard rings 82 of this example are p⁻ type semiconductor regions formed by ion implantation in the vicinity of the front surface. The guard rings 82 are electrically connected to electrode layers 84. The electrode layers 84 may have the same material as the gate metal layer 50 or the emitter electrode 52.

The plurality of guard rings 82 are electrically insulated from each other by the interlayer dielectric film 26. The depth of the bottoms of the guard rings 82 may be same as the depth of the bottom of the p⁺ type well region 17. Further, the depth of the bottoms of the guard rings 82 of this example is deeper than the depth of the bottoms of the gate trench portions 40 and the dummy trench portions 30.

The channel stopper structure includes an n⁺ type channel stopper region 88 and the electrode layer 84. The channel stopper region 88 is electrically connected to the electrode layer 84 through an opening in the interlayer dielectric film 26. Note that the channel stopper region 88 may also be a p type semiconductor region in another example. The channel stopper region 88 has a function to terminate the depletion layer, which has been generated in the active portion 70, at the outer end of the semiconductor substrate 10.

In the X direction, the well region 17 may be beyond the well-contact region 150 to extend to further outside. The well region 17 of this this example may be in proximity to the edge termination portion 80, so that the distance between the innermost guard ring 82 in the edge termination portion 80 and the outer end of the well region 17 is several micrometers. Note that, as a variation of this example, in place of the well region 17, the p⁻ type base region 14 may also be provided to be extended to the innermost guard ring 82. In this case, the distance between the innermost guard ring 82 and the outer end of the base region 14 may be several micrometers.

The opposite conductivity-type semiconductor region 23 may be provided in the X direction from the outer end Px4 of the well region 17 to the outer end Px3 of the mesa regions 60 where the accumulation regions 16 are provided. The opposite conductivity-type semiconductor region 23 may be provided in the X direction from the bottoms of the guard rings 82 via the outer end Px4 of the well region 17 to the outer end Px3 of the mesa regions 60 where accumulation regions 16 are provided. The opposite conductivity-type semiconductor region 23 of this example is provided in the X direction from the central portion Px5 of the bottom of the second guard ring 82 from the inside to the outer end Px3 of the mesa regions 60 (the outer end of the mesa region 60 between the sixth dummy trench portion 30 and the seventh dummy trench portion 30 from the outside) where the accumulation regions 16 are provided. In this example, since the opposite conductivity-type semiconductor region 23 is provided in wider range compared with the second embodiment, it is possible to effectively avoid current crowding to the well region 17 compared with the second embodiment. Note that, though not explicitly shown in the cross section, an insulating film such as the gate insulating film 42 is formed between the gate runner 51 and the semiconductor substrate 10. That is, the gate runner 51 is insulated from the semiconductor substrate 10 by the insulating film.

Note that, though the manufacturing method of the semiconductor device 100 or the like is not particularly specified, it is possible to manufacture the semiconductor device 100 or the like by accordingly using known techniques such as ion implantation, annealing, deposition, thermal oxidation, sputtering, and spin-coating.

Figure 10:
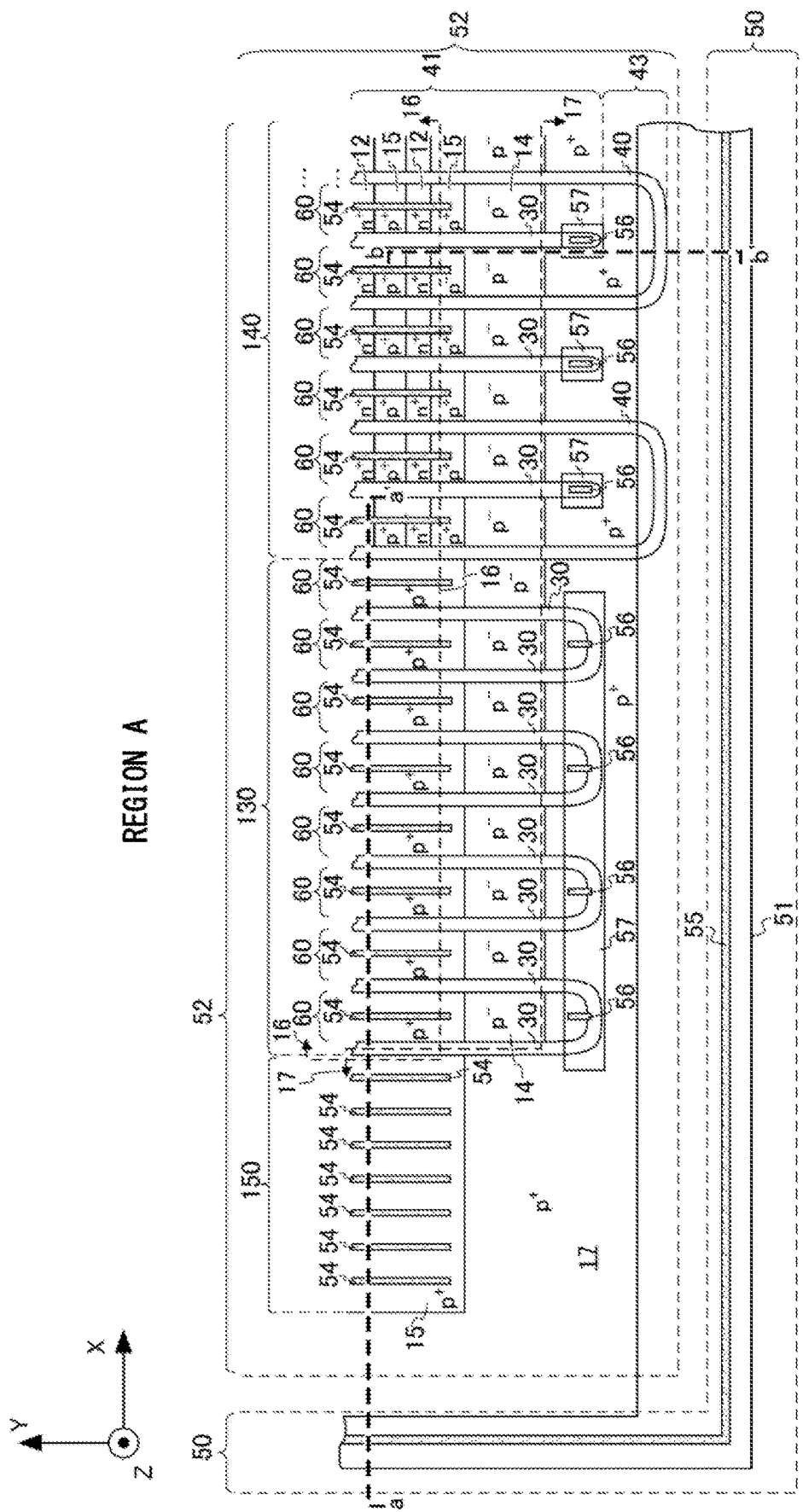
FIG. 10 is an enlarged view of the region A in a semiconductor device 400 according to a fourth embodiment.

FIG. 10 is an enlarged view of the region A in a semiconductor device 400 according to a fourth embodiment. Note that, though a top view of the semiconductor device 400 is not illustrated, the top view of the semiconductor device 400 may be same as the semiconductor device 100 shown in FIG. 1. The dummy trench region 130 in the active portion 70 of this example includes the accumulation regions 16 in all mesa regions 60 between the plurality of dummy trench portions 30. The outer end of the accumulation regions 16 in the X direction is located outside from the inner end of the well region 17 in the X direction. Further, the accumulation region 16 of this example may be located outside from the dummy trench portion 30 located outermost. In this example, the dummy trench portion 30 located outermost refers to the dummy trench portion 30 closest to the edge termination portion 80.

Figure 11:
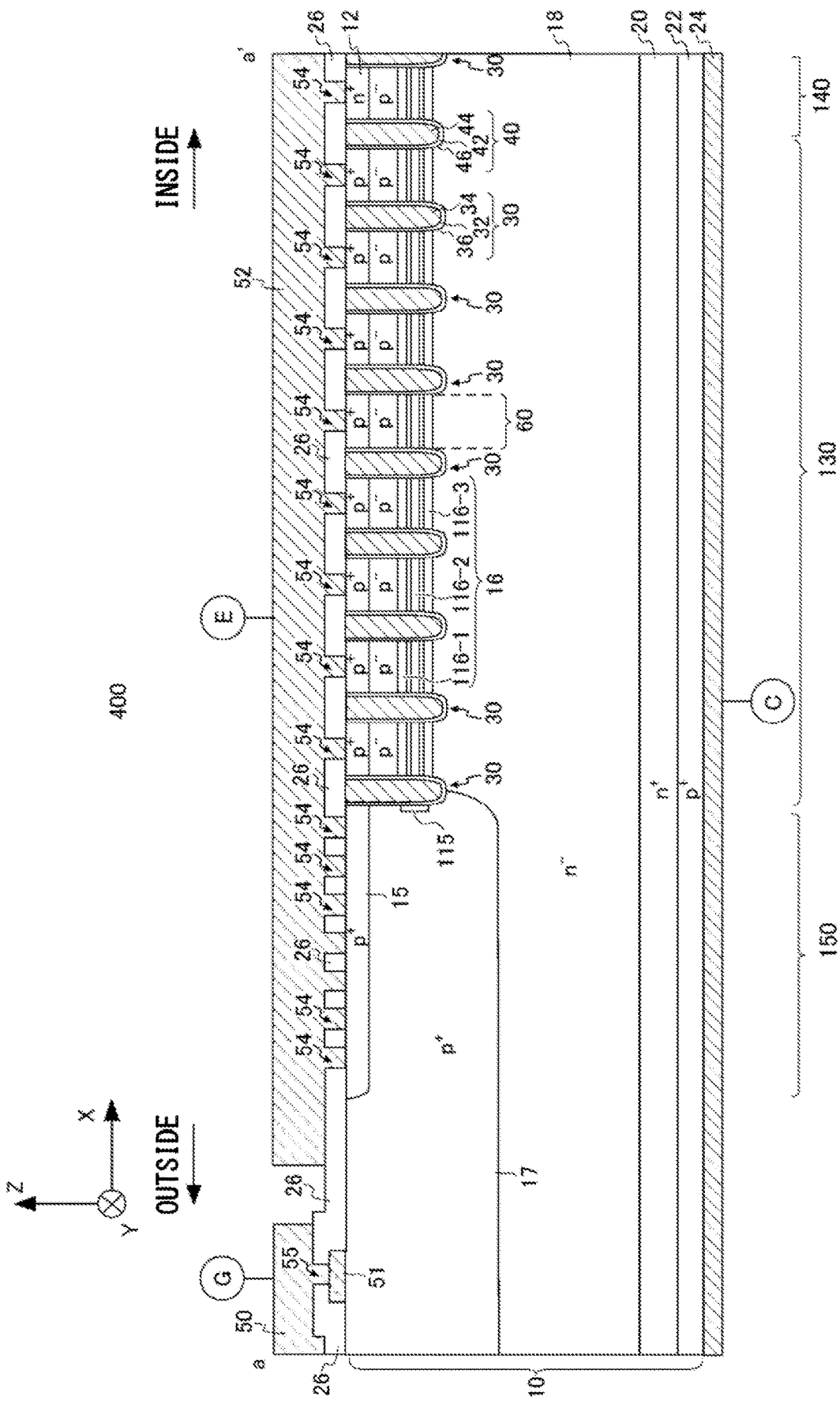
FIG. 11 is a cross-sectional view taken along a-a' of the semiconductor device 400 according to the fourth embodiment.

FIG. 11 is a cross-sectional view taken along a-a' of the semiconductor device 400 according to the fourth embodiment. The accumulation region 16 may include a plurality of accumulation layers 116 spaced apart in the Z direction. The accumulation regions 16 of this example include three accumulation layers 116-1, 116-2, and 116-3, which are spaced apart in the Z direction. As the number of accumulation layers 116 is greater, the influence of the misalignment (position shift) of the mask 110 or the sag of the mask 110 can be reduced. Further, as the number of accumulation layers 116 is greater, the breakdown voltage of the semiconductor device 400 can be high. Note that the accumulation regions 16 may also include one or two accumulation layers 116 in another example.

The accumulation region 16 of this example includes the outermost portion 115 located outside from the dummy trench portion 30 located outermost. Even if the accumulation region 16 includes one or two accumulation layers 116, the accumulation region 16 may include the outermost portion 115. The outermost portion 115 may include one or more accumulation layers 116. It is possible to eliminate the influence of the sag of the mask 110 not only from the mixed trench region 140, but also from the dummy trench region 130 by providing the outermost portion 115.

Figure 12:
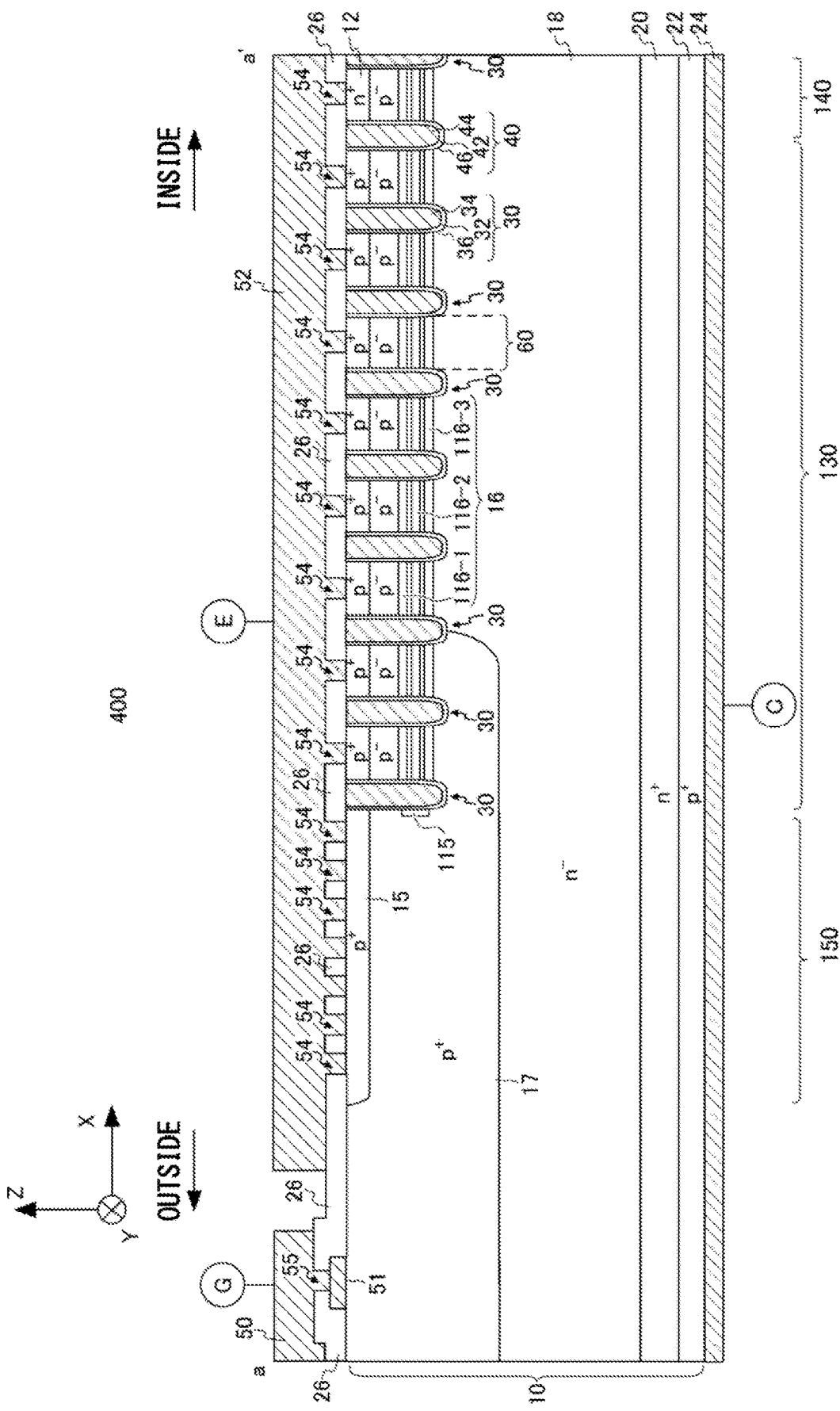
FIG. 12 is a cross-sectional view taken along a-a' of a semiconductor device 400 according to a variation of the fourth embodiment.

FIG. 12 is a cross-sectional view taken along a-a' of a semiconductor device 400 according to a variation of the fourth embodiment. The well region 17 may cover the bottoms of two or more dummy trench portions 30 among the plurality of dummy trench portions 30. The well region 17 of this example covers the bottoms of three dummy trench portions 30 located outermost in the X direction. By providing the dummy trench portions 30 in the well region 17, it becomes easier to extract holes to the emitter electrode 52 via the well region 17, so that the turn-off power loss can be reduced. Note that in order for holes to be more easily extracted, the well region 17 may also cover the bottoms of three or more or four or more dummy trench portions 30 with the dummy trench portion 30 located outermost as the first.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: semiconductor substrate, 12: emitter region, 14: base region, 15: contact region, 16: accumulation region, 17: well region, 18: drift region, 20: buffer region, 22: collector region, 23: opposite conductivity-type semiconductor region, 24: collector electrode, 26: interlayer dielectric film, 30: dummy trench portion, 32: dummy trench insulating film, 34: dummy trench conductive portion, 36: dummy trench, 40: gate trench portion, 41: opposing portion, 42: gate insulating film, 43: protruding portion, 44: gate conductive portion, 46: gate trench, 50: gate metal layer, 51: gate runner, 52: emitter electrode, 54, 55, 56: contact-hole, 57: connecting portion, 60: mesa region, 70: active portion, 72: IGBT region, 74: FWD region, 76: temperature detecting diode, 80: edge termination portion, 82: guard ring, 84: electrode layer, 88: channel stopper region, 90: pad portion, 92: gate pad, 93: sense-IGBT, 94: sense-emitter pad, 96: anode pad, 98: cathode pad, 100: semiconductor device, 110: mask, 112: mask sag region, 115: outermost portion, 116: accumulation layer, 117: curved portion, 130: dummy trench region, 140: mixed trench region, 145: gate trench region, 150: well-contact region, 200, 300, 400, 500: semiconductor device

What is claimed is:

1. A semiconductor device comprising:
an edge termination portion provided in a peripheral portion of a semiconductor substrate; and
an active portion surrounded by the edge termination portion,
wherein the active portion includes:
a plurality of gate trench portions arrayed along a predetermined array direction;
a plurality of dummy trench portions provided between a gate trench portion closest to the edge termination portion among the plurality of gate trench portions and the edge termination portion;
mesa regions located between each of the plurality of dummy trench portions;
accumulation regions with a first conductivity-type provided in at least a part of the mesa regions, the accumulation regions with the first conductivity-type provided directly above a drift region with the first conductivity-type in a depth direction; and
an emitter electrode that electrically connects to a dummy conductive portion within each dummy trench portion through a contact-hole,
wherein the active portion includes a mixed trench region in which a dummy trench portion in the plurality of dummy trench portions and a gate trench portion in the plurality of gate trench portions are provided alternately in the array direction,
wherein the mixed trench region includes base regions with a second conductivity-type, the accumulation regions, and the drift region with the first conductivity-type, which are provided in this order in the depth direction from a front surface toward a back surface of the semiconductor substrate.

2. The semiconductor device according to claim 1, wherein the active portion further includes contact regions with the second conductivity-type on the front surface of the mesa regions between the plurality of dummy trench portions.

3. The semiconductor device according to claim 1, wherein the active portion does not include the accumulation regions in at least one mesa region among the mesa regions between the plurality of dummy trench portions.

4. The semiconductor device according to claim 1, wherein the active portion further comprises:
a well region with the second conductivity-type covering bottoms of two or more dummy trench portions among the plurality of dummy trench portions.

5. The semiconductor device according to claim 4, wherein the active portion comprises the mesa regions that do not include the accumulation regions between the well region and the mesa regions including the accumulation regions.

6. The semiconductor device according to claim 4, wherein the active portion further comprises:
a drift region with the first conductivity-type having lower concentration than the accumulation regions;
a collector region with the second conductivity-type located below the drift region;
an opposite conductivity-type semiconductor region with the first conductivity-type located below the drift region in right below the plurality of dummy trench portions, having higher concentration than the drift region.

7. The semiconductor device according to claim 6, wherein the opposite conductivity-type semiconductor region is provided in the array direction from an inner end of the well region to an outer end of the mesa regions where the accumulation regions are provided.

8. The semiconductor device according to claim 6, wherein the opposite conductivity-type semiconductor region is provided in the array direction from the outer end of the well region to the outer end of the mesa regions where the accumulation regions are provided.

9. The semiconductor device according to claim 8, wherein the opposite conductivity-type semiconductor region is provided in the array direction from the bottoms of guard rings provided in the edge termination portion via the outer end of the well region to the outer end of the mesa regions where the accumulation regions are provided.

10. The semiconductor device according to claim 1, wherein the active portion comprises the accumulation regions in all the mesa regions between the plurality of dummy trench portions.

11. The semiconductor device according to claim 10, wherein the accumulation regions comprise the outermost portion located outside from the dummy trench portion closest to the edge termination portion among the plurality of dummy trench portions.

* * * * *